United States Patent [19]

Chen et al.

[11] Patent Number: 5,317,192
[45] Date of Patent: May 31, 1994

[54] SEMICONDUCTOR CONTACT VIA STRUCTURE HAVING AMORPHOUS SILICON SIDE WALLS

[75] Inventors: Fusen E. Chen; Girish A. Dixit, both of Dallas; Che-Chia Wei, Plano County, all of Tex.

[73] Assignee: SGS-Thomson Microelectronics, Inc., Carrollton, Tex.

[21] Appl. No.: 879,190

[22] Filed: May 6, 1992

[51] Int. Cl.$^5$ .......................................... H01L 29/400
[52] U.S. Cl. ..................... 257/750; 257/753; 257/760
[58] Field of Search ............... 257/758, 760, 774, 741, 257/734, 750, 754, 753

[56] References Cited

U.S. PATENT DOCUMENTS

| | | | |
|---|---|---|---|
| 4,489,481 | 12/1984 | Jones | 29/591 |
| 4,549,914 | 10/1985 | Oh | 257/369 |
| 4,641,420 | 2/1987 | Lee | 257/774 |
| 4,835,597 | 5/1989 | Okuyama et al. | 257/760 |
| 4,898,841 | 2/1990 | Ho | 437/187 |
| 4,982,266 | 1/1991 | Chatterjee | 257/758 |
| 5,003,062 | 3/1991 | Yen et al. | 437/231 |
| 5,117,273 | 5/1992 | Stark et al. | 437/180 |

FOREIGN PATENT DOCUMENTS

| | | | |
|---|---|---|---|
| 0155699 | 9/1955 | European Pat. Off. . | |
| 0165513 | 12/1985 | European Pat. Off. . | |
| 0388862 | 9/1990 | European Pat. Off. . | |
| 0237441 | 10/1988 | Japan | 257/752 |
| 0253647 | 10/1988 | Japan | 257/773 |
| 0144940 | 6/1990 | Japan | 257/760 |
| 0165624 | 6/1990 | Japan | 257/754 |
| 0239348 | 10/1991 | Japan | 257/776 |
| 2110876 | 6/1983 | United Kingdom . | |
| 8702828 | 5/1987 | World Int. Prop. O. | 257/760 |

OTHER PUBLICATIONS

Patent Abstracts of Japan, JP 3006827, Jan. 14, 1991, vol. 15, No. 114, E1047, Kenji, 1 sheet.
Patent Abstracts of Japan, JP 1192137, Feb. 8, 1989, vol. 13, No. 483 E839, Shigeki et al., 1 sheet.
Electronics Sep. 22, 1983, New York pp. 48–49 W. R. Iversen, "Amorphous Vias In Wafer Link Chips", p. 49.

*Primary Examiner*—Rolf Hille
*Assistant Examiner*—Peter Toby Brown
*Attorney, Agent, or Firm*—Kenneth C. Hill; Lisa K. Jorgenson; Richard K. Robinson

[57] ABSTRACT

A method is provided for forming an integrated circuit contact structure. A conductive region is formed on a semiconductor device. Thereafter an insulating layer is formed over the conductive region. An opening is then formed through the insulating region to the conductive region. A thin barrier layer is deposited over the integrated circuit contact structure. A portion of the thin barrier layer is removed by backsputtering the integrated circuit contact structure so that only a thin barrier sidewall remains. Finally, a conductive metal layer is deposited over the integrated circuit contact structure. In one embodiment, the integrated circuit contact structure is baked before the conductive metal layer is deposited.

8 Claims, 1 Drawing Sheet

SEMICONDUCTOR CONTACT VIA STRUCTURE HAVING AMORPHOUS SILICON SIDE WALLS

BACKGROUND OF THE INVENTION

1. Field of the Invention

The present invention relates generally to semiconductor integrated circuits, and more specifically to formation of a contact structure for such circuits.

2. Description of the Prior Art

In fabricating semiconductor integrated circuits, the integrity of various structures on the circuits is of great importance. Undesirable impurities in the wrong portions of a circuit can adversely affect its functioning.

One type of structure commonly found on a semiconductor integrated circuit is a contact from an upper level metal interconnect layer to a lower conductive structure through a contact via. An insulating layer though which the contact via is cut often has a reflow glass layer or spin-on glass layer to improve planarity of the chip's surface. These glass layers typically have impurities which can migrate into the metal interconnect in the via and adversely affect its operation. For example, it is known that mobile ion donation from glass layers in contact with metal interconnect can shift data retention voltages in memory circuits. Also, outgassing of solvents in such glass layers can cause voiding in, or oxidation of, sputtered metal interconnect.

Since the formation of a reflowable glass layer or a spin-on glass layer improves the planarity of the integrated circuit, it is important to use such material in insulation layers. It would be desirable to provide a technique which allows the planarity improvement of such glass layers without contamination of interconnect by the impurities used in standard glass.

SUMMARY OF THE INVENTION

A method is provided for forming an integrated circuit contact structure. A conductive region is formed on a semiconductor device. Thereafter an insulating layer is formed over the conductive region. An opening is then formed through the insulating region to the conductive region. A thin barrier layer is deposited over the integrated circuit contact structure. A portion of the thin barrier layer is removed by backsputtering the integrated circuit contact structure so that only a thin barrier sidewall remains. Finally, a conductive metal layer is deposited over the integrated circuit contact structure. In one embodiment, the integrated circuit contact structure is baked before the conductive metal layer is deposited.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
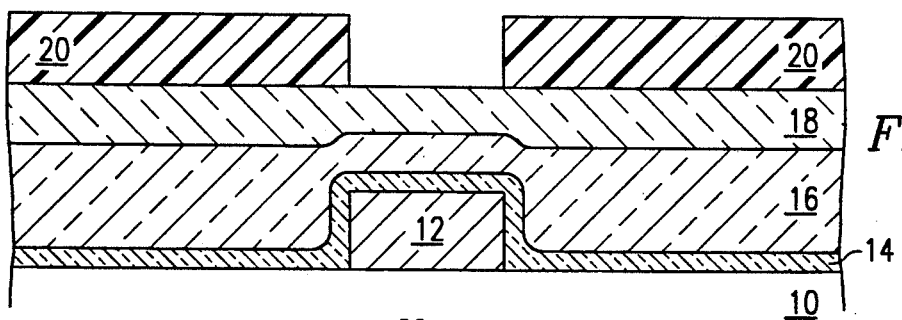
FIGS. 1-4 are sectional views of an integrated circuit illustrating a preferred method for forming contact vias according to the present invention.

Referring to FIG. 1, a contact is to be formed on a semiconductor substrate 10. Semiconductor substrate 10 may be simply the substrate on which an integrated circuit is formed, or it may represent multiple lower layers which have already been fabricated. The details of any such multiple lower layers are not important to the present invention.

A conductive region 12 is defined and patterned on the semiconductor substrate 10. Conductive region 12 may be a first metal level interconnect layer, or it may be polycrystalline silicon or a silicided polycrystalline silicon layer. A conformal insulating layer 4 is formed over the surface of semiconductor substrate 10 and conductive region 12. Conformal insulating layer 14 is preferably an oxide layer, undoped or lightly doped as known in the art. Conformal insulating layer 14 is typically deposited using chemical vapor deposition (CVD) or low pressure chemical vapor deposition (LPCVD).

A planarizing insulating layer 16 is next formed over the conformal insulating layer 12. Planarizing insulating layer 16 may be a spin-on glass layer or a reflowable glass layer. As known in the art, a reflowable glass layer may be comprised of phospo-silicate glass or boro-phospo-silicate glass. An undoped oxide layer s is then formed over planarizing insulating layer 16.

Figure 2:
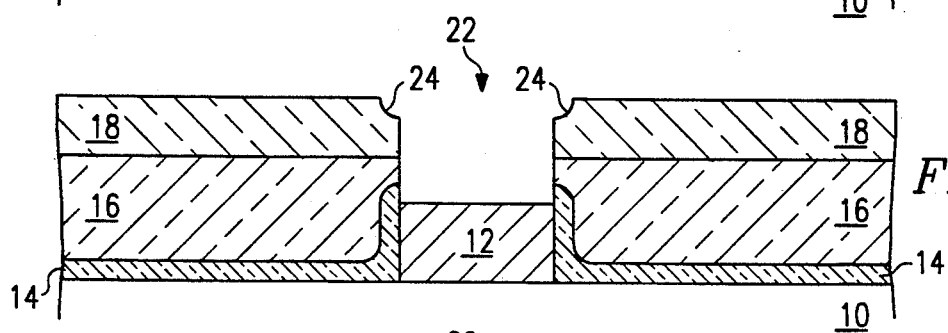

Now referring to FIGS. 1 and 2, a photoresist mask 20 is used to define and etch an opening or contact via 22. Photoresist mask 20 is then removed. Contact via 22 provides an opening through conformal insulating layer 14 and planarizing insulating layer 16 to conductive region 12. Contact via 22 is formed by first performing an isotropic etch partially through undoped oxide layer 18. The isotropic etch causes the sidewalls of contact via 22 to be curved as illustrated at 24. Those skilled in the art will recognize that this isotropic etch removes sharp corners which can cause step coverage problems. An anisotropic etch is then performed through contact via 22 to conductive region 12.

Figure 3:
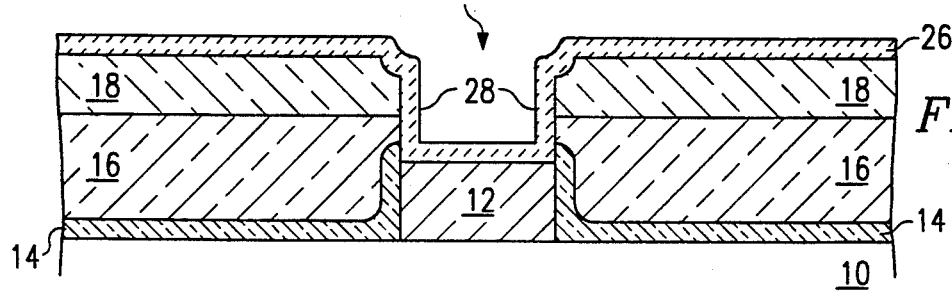

Referring now to FIG. 3, a thin barrier layer 26 is deposited over the integrated circuit. This layer may be amorphous silicon or oxide. Thin barrier layer 26 forms a thin barrier sidewall 28 along the sidewall of contact via 22. The horizontal portions of thin barrier layer 26 are then removed by backsputtering the integrated circuit, thus leaving only thin barrier sidewall 28. This backsputtering step can be simply the normal backsputtering typically performed to clean exposed surfaces prior to deposition of a next conductive layer. In this manner, no additional etching is necessary to remove thin barrier layer 26 and leave only thin barrier sidewall 28.

Figure 4:
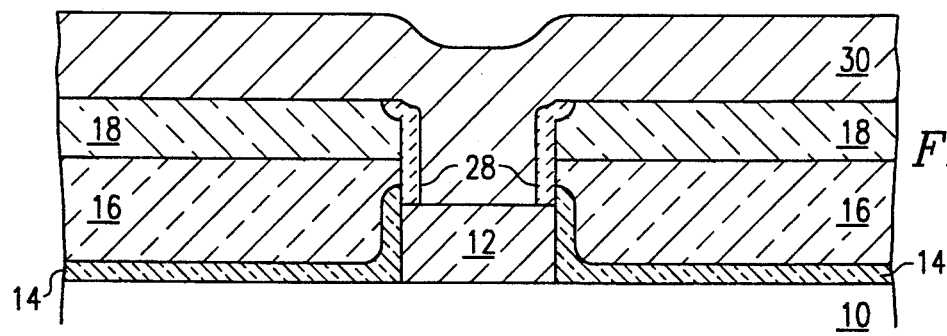

With reference to FIG. 4, a conductive metal layer 30, comprising a metal such as aluminum, is deposited over the integrated circuit. Planarizing insulating layer 16 is completely isolated from contact via 22 by thin barrier sidewalls 28. Conductive metal layer 30 is completely isolated from planarizing insulating layer 16. Thus, conductive metal layer 30 is protected from impurities contained within planarizing insulating layer 16.

Figure 5:
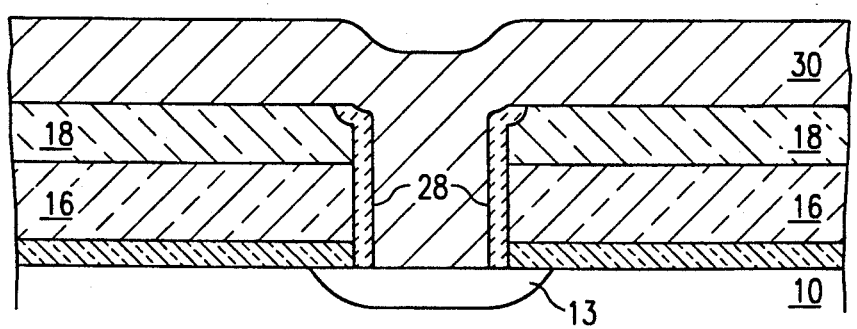
FIG. 5 is a sectional view of an alternate contact via structure according to the present invention.

With reference to FIG. 5, it is appreciated that the conductive region to which contact is made may be a conductive region 13 formed in the substrate.

In another embodiment of the present invention, the integrated circuit is baked before conductive metal layer 30 is deposited. The baking process may occur at 250°–450° C. for 15–60 minutes, reducing the amount of moisture present within spin-on glass layer 16. This helps to achieve a better step coverage in contact via 22.

As will be appreciated by those skilled in the art, the method described above, and the structure formed thereby, provides for isolation of a conductive metal layer and contact from a planarizing insulating layer comprised of spin-on glass or reflowable glass. Formation of thin barrier sidewall 28 is completed with no need for additional etching to remove thin barrier layer 26 other than backsputtering. This technique is compatible with standard process flows currently in use and allows for improved contact formation while retaining the advantages of using a reflow and spin-on glass for planarization.

While the invention has been particularly shown and described with reference to a preferred embodiment, it will be understood by those skilled in the art that various changes in form and detail may be made therein without departing from the spirit and scope of the invention.

What is claimed is:

1. A contact structure for an integrated circuit, comprising:
   an underlying conductive structure;
   a first conformal oxide layer overlying the underlying conductive structure, such first conformal oxide layer being undoped or lightly doped;
   a planarizing oxide layer overlying the first conformal oxide layer, such planarizing oxide layer having a large amount of impurities;
   a second conformal oxide layer, such second conformal oxide layer being undoped;
   an opening through the second conformal oxide layer, the planarizing oxide layer, and the first conformal oxide layer to expose a portion of the underlying conductive structure;
   thin sidewalls of amorphous silicon alongside sides of the opening, separating the opening from the first and second conformal oxide layers and the planarizing oxide layer; and
   a conductive interconnect layer lying on the second conformal oxide layer and extending into the opening, and separated from the planarizing oxide layer and the first and second conformal oxide layers in the opening by the thin amorphous silicon sidewalls.

2. The structure of claim 1, wherein the underlying conductive structure comprises an interconnect structure.

3. The structure of claim 1, wherein the underlying conductive structure comprises a conductive region in a substrate.

4. The contact structure according to claim 1, wherein the planarizing oxide layer comprises a layer of spin-on glass.

5. The contact structure according to claim 1, wherein the planarizing oxide layer comprises a layer of reflow glass.

6. The contact structure according to claim 5, wherein the layer of reflow glass comprises phospo-silicate glass.

7. The contact structure according to claim 5, wherein the layer of reflow glass comprises boro-phospo-silicate glass.

8. The contact structure according to claim 4, wherein the layer of spin-on glass comprises regions having a lesser water content, wherein the regions are a result of baking the contact structure after the opening is formed.

* * * * *